United States Patent
Mamaghani et al.

(10) Patent No.: US 10,866,842 B2
(45) Date of Patent: Dec. 15, 2020

(54) SYNTHESIS PATH FOR TRANSFORMING CONCURRENT PROGRAMS INTO HARDWARE DEPLOYABLE ON FPGA-BASED CLOUD INFRASTRUCTURES

(71) Applicant: RECONFIGURE.IO LIMITED, Bamford (GB)

(72) Inventors: Mahdi Jelodari Mamaghani, Salford (GB); Robert James Taylor, Bamford (GB)

(73) Assignee: RECONFIGURE.io LIMITED, Bamford (GB)

( * ) Notice: Subject to any disclaimer, the term of this patent is extended or adjusted under 35 U.S.C. 154(b) by 0 days.

(21) Appl. No.: 16/344,797

(22) PCT Filed: Nov. 1, 2017

(86) PCT No.: PCT/IB2017/001485
§ 371 (c)(1),
(2) Date: Apr. 24, 2019

(87) PCT Pub. No.: WO2018/078451
PCT Pub. Date: May 3, 2018

(65) Prior Publication Data
US 2020/0057681 A1    Feb. 20, 2020

Related U.S. Application Data

(60) Provisional application No. 62/412,376, filed on Oct. 25, 2016.

(51) Int. Cl.
*G06F 9/52* (2006.01)
*G06F 9/38* (2018.01)
(Continued)

(52) U.S. Cl.
CPC .............. *G06F 9/52* (2013.01); *G06F 9/3867* (2013.01); *G06F 9/48* (2013.01); *G06F 9/5027* (2013.01); *G06F 9/546* (2013.01)

(58) Field of Classification Search
USPC ........................................................ 716/116
See application file for complete search history.

(56) References Cited

U.S. PATENT DOCUMENTS

2007/0300048 A1* 12/2007 Muellers ............. G06F 11/3006
712/200
2012/0131309 A1* 5/2012 Johnson .................. G06F 15/80
712/41

(Continued)

OTHER PUBLICATIONS

Mahdi Jelodari Mamaghani et al, "Asynchronous Dataflow De-Elastisation for Efficient Heterogeneous Synthesis," 2016 16th International Conference on Application of Concurrency to System Design (ACSD), (Jun. 19, 2016), doi:10.1109/ACSD.2016.22, ISBN 978-1-5090-2589-3, pp. 104-113, XP055451166.

(Continued)

*Primary Examiner* — Mohammed Alam

(57) ABSTRACT

Exploiting FPGAs for acceleration may be performed by transforming concurrent programs. One example mode of operation may provide one or more of creating synchronous hardware accelerators from concurrent asynchronous programs at software level, by obtaining input as software instructions describing concurrent behavior via a model of communicating sequential processes (CSP) of message exchange between concurrent processes performed via channels, mapping, on a computing device, each of the concurrent processes to synchronous dataflow primitives, comprising at least one of join, fork, merge, steer, variable, and arbiter, producing a clocked digital logic description for upload to one or more field programmable gate array (FPGA) devices, performing primitive remapping of the (Continued)

output design for throughput, clock rate and resource usage via retiming, and creating an annotated graph of the input software description for debugging of concurrent code for the field FPGA devices.

20 Claims, 7 Drawing Sheets

(51) Int. Cl.
*G06F 9/48* (2006.01)
*G06F 9/50* (2006.01)
*G06F 9/54* (2006.01)

(56) References Cited

U.S. PATENT DOCUMENTS

2013/0262073 A1   10/2013   Asaad et al.
2020/0057681 A1*  2/2020    Mamaghani ........ G06F 11/3628

OTHER PUBLICATIONS

Saul J M Ed—Sprague R H Jr, "Hardware/software codesign for FPGA-based systems," Systems Sciences, 1999. HICSS-32. Proceedings of the 32nd Annual Hawai I International Conference on Maui, HI, USA Jan. 5-8, 1999, Los Alamitos, CA, USA,IEEE Comput. Soc, US, (Jan. 5, 1999), doi:10.1109/HICSS.1999.772879, ISBN 978-0-7695-0001-0, p. 10pp, XP032348178.

Stefanov T et al, "System design using Khan process networks: the Compaan/Laura approach," Design, Automation and Test in Europe Conference and Exhibition, 2004. Proceedings Feb. 16-20, 2004, Piscataway, NJ, USA,IEEE, 1730 Massachusetts Ave, NW Washington, DC 20036-1992 USA, (Feb. 16, 2004), doi:10.1109/DATE. 2004.1268870, ISBN 978-0-7695-2085-8, pp. 340-345vol. 1, XP032396460.

Andre Seffrin et al, "Hardware-accelerated execution of Pi-calculus reconfiguration schedules," Field-Programmable Technology (FPT), 2011 International Conference on, IEEE, (Dec. 12, 2011), doi:10. 1109/FPT.2011.6132710, ISBN 978-1-4577-1741-3, pp. 1-8, XP032096861.

Mahdi Jelodari Mamaghani et al, "eTeak: A Data-driven Synchronous Elastic Synthesiser," IEEE, International Conference on Application of Concurrency to System Design (ACSD), pp. 253-256; Jul. 2013.

Mahdi Jelodari Mamaghani et al., "Exploiting Synchrony for Area and Performance Improvement in the Asynchronous Domain," Book of Abstracts: International Symposium on Asynchronous Circuits and Systems (ASYNC); May 11, 2014-May 14, 2014; Potsdam, Germany. Germany: IEEE Computer Society, IHP; 2014. p. 46-48.

Mahdi Jelodari Mamaghani et al., "Automatic Clock: A Promising Approach Toward GALSification," 22nd IEEE International Symposium on Asynchronous Circuits and Systems, ASYNC 2016. vol. 2016—Oct. IEEE Computer Society , 2016. p. 83-84 7584896.

Mahdi Jelodari Mamaghani, "Curriculum Vitae," IT302—School of Computer Science, The University of Manchester, M13 9PL, Manchester, UK, EPSRC Doctoral Prize Fellow, hosted by the University of Manchester, Sep. 2016.

Mahdi Jelodari Mamaghani et al., "De-elastisation: From asynchronous dataflows to synchronous circuits," Design, Automation & Test in Europe Conference & Exhibition, Institute of Electrical and Electronics Engineers, 2015, p. 273-276.

Mahdi Jelodari Mamaghani et al., "Optimised Synthesis of Asynchronous Elastic Dataflows by Leveraging Clocked EDA," Digital System Design (DSD), 2014 17th Euromicro Conference on. USA : Institution of Electrical Engineers (IEE), 2014. p. 604-617.

Mahdi Jelodari Mamaghani et al., "High-Level Synthesis of GALS Systems," Designing with Uncertainity—Opportunities & Challenges Workshop, University of York, Mar. 17, 2014.

* cited by examiner

300

SYNTHESIS PATH FOR TRANSFORMING CONCURRENT PROGRAMS INTO HARDWARE DEPLOYABLE ON FPGA-BASED CLOUD INFRASTRUCTURES

CROSS-REFERENCE TO RELATED APPLICATION

This application is related to previously filed provisional patent application No. 62/412,376 entitled 'SYNTHESIS PATH FOR TRANSFORMING PROGRAMS INTO HARDWARE DEPLOYABLE ON FPGA-BASED CLOUD INFRASTRUCTURES', which was filed on Oct. 25, 2016, the entire contents of which are hereby incorporated by reference in their entirety.

TECHNICAL FIELD OF THE APPLICATION

This application relates to software and hardware integration and more specifically adapting a software development interface for FPGA developments.

BACKGROUND OF THE APPLICATION

Conventionally, the recent advances in concurrent programming and the formal model of communicating sequential processes (CSP) has gained popularity. The CSP model allows software designers to implement scalable concurrent software systems. However, integrated software applications with middleware and hardware platforms continues to be limited and thus leaves the developers without the resources needed to work with certain hardware development platforms such as FPGAs.

Current FPGA tooling is predicated on a methodology orientated towards development and testing cycles characteristic of hardware design, simulation and execution. IT departments trying to utilize this technology face barriers including low-level languages and representations, and failing to harness the power of modern high level language capabilities. The high cost of rare-skilled resources and expensive tooling and the high cost and barrier to entry to trial usage of such technology can also be a constraint. Communicating sequential processes (CSP) is a model of concurrency design due to C.A.R Hoare. The CSP model has historically been utilized to describe concurrency in industrial contexts. Its communication model has evolved significantly in recent years and has influenced several languages in both software and hardware domains including 'Go' and 'Balsa', respectively. Its descriptions are divisible into procedures with communication channels for message passing. Channels can be also defined for interaction between commands (actions). CSP permits component processes to be defined both as sequential processes, and as a parallel composition of more primitive processes. The relationships between different processes, and the way each process communicates with its environment, are described using various process algebraic operators.

Elasticity has emerged as a property that implies flexibility in adapting resources, communication or timing in different areas of computer architecture. Elasticity in digital circuits is referred to as the flexibility against environmental dynamics. This feature permits the circuit to preserve correct functionality while being exposed to timing variations even on a 'nano' scale and system level latencies. We exploit elasticity to realize resource management on single/multiple FPGA infrastructures.

The synchronous elastic protocol (SELF) is an efficient communication protocol that implements a state-based control flow standard over CSP channels. Elasticity is realized by adopting SELF in our circuits. SELF consists of three communication states namely 'Idle', 'Retry' and 'Transfer'. These states are governed by elastic blocks (EBs) which are distributed both in the communication and computation domains of a digital circuit. An EB resembles a flip-flop with some extra gates to implement the control mechanism based on the handshake protocol. An EB can be viewed as a pair of latches operating at opposite clock phases. In a normal mode latches operate as a flip-flop where one holds a bubble (a latch containing no data), the other holds data at any time. This way back pressure is handled by preventing the incoming data token from overwriting the existing one.

The model of CSP, unlike the model of Kahn process networks (KPNs), is expressive enough and allows description of non-deterministic behavior, such as arbitration and conditional statements based on the values of tokens. This enables the designer to exploit CSP for modelling a vast range of applications where non-deterministic and conditional behavior are possible to be modeled. Hardware acceleration using coprocessing is the use of computer hardware to perform some functions more efficiently than is possible in software running on a more general-purpose CPU. Hardware accelerators may include GPUs, FPGAs, novel processor design and custom ASICs (application specific integrated circuits). APIs are the defined interfaces through which interactions happen between a system and applications that use those assets. An API approach is an architectural approach that revolves around providing programmable interfaces to a set of services to different applications serving different types of consumers. When used in the context of web development, an API is typically defined as a set of hypertext transfer protocol (HTTP) request messages, along with a definition of the structure of response messages.

According to one example, 'big-data' is defined as data sets with sizes beyond the ability of current technology, to capture, manage, and process within a tolerable elapsed time. Big-data applications, such as eCommerce, machine learning, social networking, digest large amounts of data to provide valuable information for end users on the fly. According to GOOGLE statistics (2011) over 4 million search queries per minute are received by their servers, and processed, at about 20 petabytes of information per day. This amount will grow by orders of magnitude in the near future. Therefore, powerful acceleration infrastructures, such as cloud based processing and storage services, are required to fulfil this enormous demand.

Cloud computing provides a commoditized source of computing (i.e., on the fly computing) and reduces the total cost of infrastructure creation and management as cloud service providers, such as AMZON EC2, GOOGLE CLOUD and IBM, offer powerful tooling to manage end user tasks on demand (i.e., elastically) with unlimited storage. Today, cloud service providers receive billions of queries per day from major enterprise customers which requires the cloud applications (software) to be fast enough in processing data. The conventional CPU based technologies fail to cope with this rapid data processing requirement. This has been the reason why the major cloud service providers have incorporated FPGA support in their infrastructures, e.g. AWS F1, which allows the cloud users to deploy their own custom processing units in the cloud servers on FPGA cards and get accelerated services. This enhances the computing flexibility and improves productivity of the cloud applications in terms of processing time and energy.

To enable cloud application developers to deploy their custom processing units suitable FPGA tooling is necessary. Also, a mechanism that permits software developers without any hardware skills to synthesize their written application in a language such as GO, may produce one or more separate and acceleratable data modules which can be stored and deployed onto FPGA-based cloud computing infrastructures.

SUMMARY OF THE APPLICATION

One example embodiment of the present application may provide a method that includes creating synchronous hardware accelerators from concurrent asynchronous programs at software level, the method may include at least one of obtaining input as software instructions describing concurrent behavior via a model of communicating sequential processes (CSP) of message exchange between concurrent processes performed via channels, mapping, on a computing device, each of the concurrent processes to synchronous dataflow primitives, comprising at least one of join, fork, merge, steer, variable, and arbiter, producing a clocked digital logic description for upload to one or more field programmable gate array (FPGA) devices, performing primitive remapping of the output design for throughput, clock rate and resource usage via retiming, and creating an annotated graph of the input software description for debugging of concurrent code for the field FPGA devices.

Another example embodiment may include an apparatus configured to create synchronous hardware accelerators from concurrent asynchronous programs at software level, the apparatus may include a processor configured to obtain input as software instructions describing concurrent behavior via a model of communicating sequential processes (CSP) of message exchange between concurrent processes performed via channels, map each of the concurrent processes to synchronous dataflow primitives, comprising at least one of join, fork, merge, steer, variable, and arbiter, produce a clocked digital logic description for upload to one or more field programmable gate array (FPGA) devices, perform primitive remapping of the output design for throughput, clock rate and resource usage via retiming, and create an annotated graph of the input software description for debugging of concurrent code for the field FPGA devices.

Still another example embodiment may include a non-transitory computer readable storage medium configured to store instructions that when executed causes a processor to perform creating synchronous hardware accelerators from concurrent asynchronous programs at software level, the processor being further configured to perform obtaining input as software instructions describing concurrent behavior via a model of communicating sequential processes (CSP) of message exchange between concurrent processes performed via channels, mapping, on a computing device, each of the concurrent processes to synchronous dataflow primitives, comprising at least one of join, fork, merge, steer, variable, and arbiter, producing a clocked digital logic description for upload to one or more field programmable gate array (FPGA) devices, performing primitive remapping of the output design for throughput, clock rate and resource usage via retiming, and creating an annotated graph of the input software description for debugging of concurrent code for the field FPGA devices.

DETAILED DESCRIPTION OF THE APPLICATION

Figure 1:
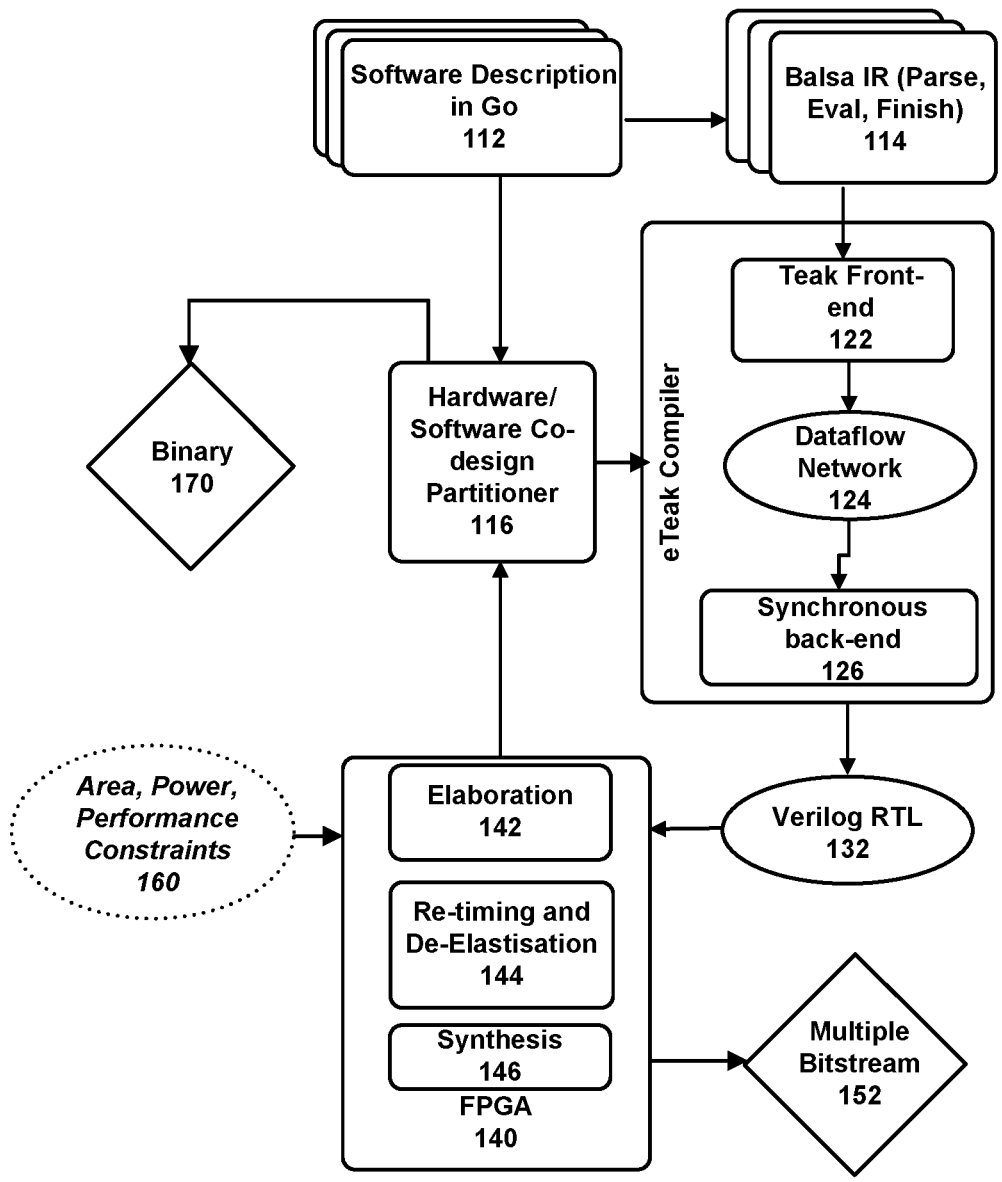
FIG. 1 illustrates an example logic flow diagram of software and FPGA integration according to example embodiments.

It will be readily understood that the components of the present application, as generally described and illustrated in the figures herein, may be arranged and designed in a wide variety of different configurations. Thus, the following detailed description of the embodiments of a method, apparatus, and system, as represented in the attached figures, is not intended to limit the scope of the application as claimed, but is merely representative of selected embodiments of the application.

The features, structures, or characteristics of the application described throughout this specification may be combined in any suitable manner in one or more embodiments. For example, the usage of the phrases "example embodiments", "some embodiments", or other similar language, throughout this specification refers to the fact that a particular feature, structure, or characteristic described in connection with the embodiment may be included in at least one embodiment of the present application. Thus, appearances of the phrases "example embodiments", "in some embodiments", "in other embodiments", or other similar language, throughout this specification do not necessarily all refer to the same group of embodiments, and the described features, structures, or characteristics may be combined in any suitable manner in one or more embodiments.

In addition, while the term "message" has been used in the description of embodiments of the present application, the application may be applied to many types of network data, such as, packet, frame, datagram, etc. For purposes of this application, the term "message" also includes packet, frame, datagram, and any equivalents thereof. Furthermore, while certain types of messages and signaling are depicted in exemplary embodiments of the application, the application is not limited to a certain type of message, and the application is not limited to a certain type of signaling.

Example embodiments provide a method of producing synchronous digital designs from a software description utilizing certain synchronization primitives, including input in the form of software instructions describing concurrent behavior via communicating sequential processes (CSP), with primitives of message passing between concurrent processes via channels. The input may be transformed into a synchronous (clocked) digital logic description suitable for, but not limited to, being uploaded to one or more field programmable gate array (FPGA) devices.

The optimization of the output throughput may be based on a clock rate and/or resource usage. In operation, engineers may provide a description via direct upload or a source code management system to a remotely hosted service which can then transform, deploy, debug and/or test the software instructions. This may include the use of an animated graph visualization for the understanding and debugging of concurrent code for FPGA devices and other systems. The measurement and collation of timing information from deployed systems may provide debugging and analysis of behavior and concurrency.

Code partitioning is the deployment of software instructions to hardware of different architectures, capabilities and/or topologies based on software instructions and system analysis including but not limited to tools to analyze and visualize concurrent behavior of CSP code. Compiler tooling may permit engineers to target different hardware, such as FPGAs, GPUs, many core systems from the same code base, including analytic decisions for whether to use dataflow or state machine representations. Deployment tools can support the deployment of a single or multiple code bases over a number of connected hardware systems.

Tools to analyze performance of the systems may guide operators and software developers in optimizing the systems. Example embodiments provide for the provisioning of HTTP based APIs and software systems as a platform as a service, for the compilation, deployment, management, measurement, analysis and optimization of systems deployed over a number of connected hardware systems. Other features include the orchestration of resource and resource connectivity, dynamic management of resource utilization, control of resources utilized based on performance requirement analysis, for example, in response to demand.

Example embodiments provide a systematic method and system to enable hardware and software designers to cope with the ever increasing complexity of computing infrastructures. The proposed systematized method overcomes the lack of familiarity of developers at a software level with the hardware level challenges such as technology, protocols, data encoding and clocking details. This bridges the gap between the software and hardware domain, and increases the developer's productivity and capabilities.

Example embodiments provide a heterogeneous environment where high-level CSP descriptions are selectively transformed into FPGA-synthesizable structures. This enables a software developer to accelerate code without concern for timing issues at system level.

FIG. 1 illustrates an example FPGA synthesis logic flow according to example embodiments. Referring to FIG. 1, the example 100 includes a software description 112 recognized as a common programming language such as GOOGLE's GO language. Other implementations, platforms, compilers and/or systems may be used as readily recognized by one having ordinary skill in the art. An eTeak synthesis from CSP to synchronous circuits (SELF). The main application file or main program may be parsed and evaluated via a preparatory software tool, such as BALSA 114. An eTeak compiler may include a front-end 122, a dataflow network 124 and a back end 126, which may be use the SELF protocol to adopt synchrony in Teak networks of macro-modules.

The hardware/software partitioner 116 may access the binary data 170. Synthesis synchronous procedures of eTeak are adapted to operate with FPGAs by using a third-party synthesis tool from the FPGA vendor, such as a XILINX FPGA, to elaborate the generated VERILOG netlists 132 of the eTeak and perform resource sharing/mapping, elaboration 142, re-timing and de-elastization 144 and synthesis 146, and produce bitstreams 152 that are loadable onto FPGA. Those portions of this exemplary system affect power and performance constraints 160.

De-elastization (pipelining) as an optimization technique toward efficiency may include synchronous elastic circuits of eTeak, which are able to tolerate variation in timing due to their elastic nature. Elasticity could impose a prohibitive impact on the overall performance of the system, therefore de-elastization is applied as a pipelining method to remove elasticity (i.e., handshake components of SELF) selectively from the design and introduce synchronous rigidity locally into the circuit. This provides fast synchronous circuits on a single FPGA, however intra-FPGA communications remain elastic to tolerate any plausible delays.

Hardware/software high-level code partitioning may be used to accelerate high-level CSP codes by using eTeak synthesis framework to transform software level instructions to high-performance hardware entities. HW/SW partitioning is necessary as not every chunk of high-level code is transformable to hardware efficiently. Therefore, an analysis mechanism is proposed which partitions the high-level code into chunks and then selects the best transformation procedure based on the behavioral factors, such as memory accesses, control and data dependencies, etc.

This technique can be expanded to cover different accelerator types, such as GPU and MANYCORE. Different data access patterns and behavioral characteristics of a section of code can be used to setup the mapping of that code to different classes of processing hardware. The optimal placement can be made, possibly with developer input of code on accelerator hardware or general CPU in a given configuration of connected server hardware.

Visualization is important to the general applicability of the system as the ability of engineers and designers to understand the concurrent behavior of their designs is imperative. Visualization of CSP for debugging at a higher abstraction level may include Teak's graphical engine being adopted to visualize CSP procedures and provide a debugging mechanism to software programmers to be able to trace their concurrent programs in a multi-FPGA system. This approach could benefit cloud programmers to develop "correct" concurrent programs for future data center architectures. A Restful HTTP API and software tool is used to enable developers in developing software systems that utilize FPGAs. The Restful API permits a developer to request that code provided directly, or in a source code repository is combined with other infrastructural code and used to produce an FPGA bitstream, and that this bit stream is loaded into an FPGA located in a datacenter. This infrastructural code would include interfaces to cover communication with direct attached memory, main system memory and/or CPU via a system interconnect, such as QPI, PCIe or NVLink. Other accelerators and FPGAs vis standard or custom interconnect and other types of hardware, for example storage may be used.

Other code provided will be compiled targeting the host processor attached to said FPGA, and these will be set running by control systems on customer request. The HTTP API also provides methods to stop, and return resources for use by other users. Methods are provided to account for resource usage. Further, the API provides a way to insert trace points into the FPGA and/or main CPU execution to trace, analyze and visualize code behavior. A tracepoint is a section of software code or hardware entity that measures aspects of behavior and provides a way to inform a monitoring system of the behavior being measured. Methods could be provided to preprocess trace data before delivery via HTTP or another Internet messaging protocol.

The HTTP API is also provided to permit the reporting and handling of errors in a deployed component. Infrastructure may also be provided for handling of failures with restart and handover. A software tool to access this API that works as a part of normal application development flow provides a developer with access to the above described functionality. In combination with above described code development environment, a further HTTP API provides the ability to run code over a number of separate servers, CPUs, FPGAs and other potential accelerators utilizing different methods of interconnection between such elements.

Deployment from source code control may enable ease of deployment, APIs and command line tools which are provided to permit a developer to ask for the deployment of code residing in a cloud or private source code control system, such as GITHUB. The service would then make a copy of the code, compile it to FPGA bitstreams, CPU executable binaries or output for other accelerators, and using rules described in the source, deploy this configuration over hardware. This hardware could be hosted in the cloud, or based on a specific site.

Additional embodiments may include using GO with FPGA synthesis by FPGA payloads from the GO language by using LLVM as an intermediate form to transform GO to finite state machines. This would entail using 'llgo' or a similar tool to compile GO to an LLVM IR representation. Then, in a single or over multiple passes, convert this representation to finite state machines. A final pass would then convert the (FSM) representations to verilog for synthesis with commercial FPGA tooling. Optimization of the FSM transformation may be done with directed profiling and feedback to FSM transformation annotation of communication channels and synthesis.

List scheduling may be used to optimize clock usage, which reduces bit-width of data paths when possible. Minimization of clock tree depth can also be used to maximize parallelism.

In FIG. 1 there are three main components to the system according to the example embodiments. The eTeak compiler is a compiler that includes the Teak front-end 122 and processes dataflow 124 to provide a synchronous backend 126. The hardware/software co-design partitioner 116 provides a portal for data integration with the eTeak compiler. The re-timing and de-elastisation module 144 may provide performance enhancement, timing and synthesis for multiple bitstreams.

Figure 2:
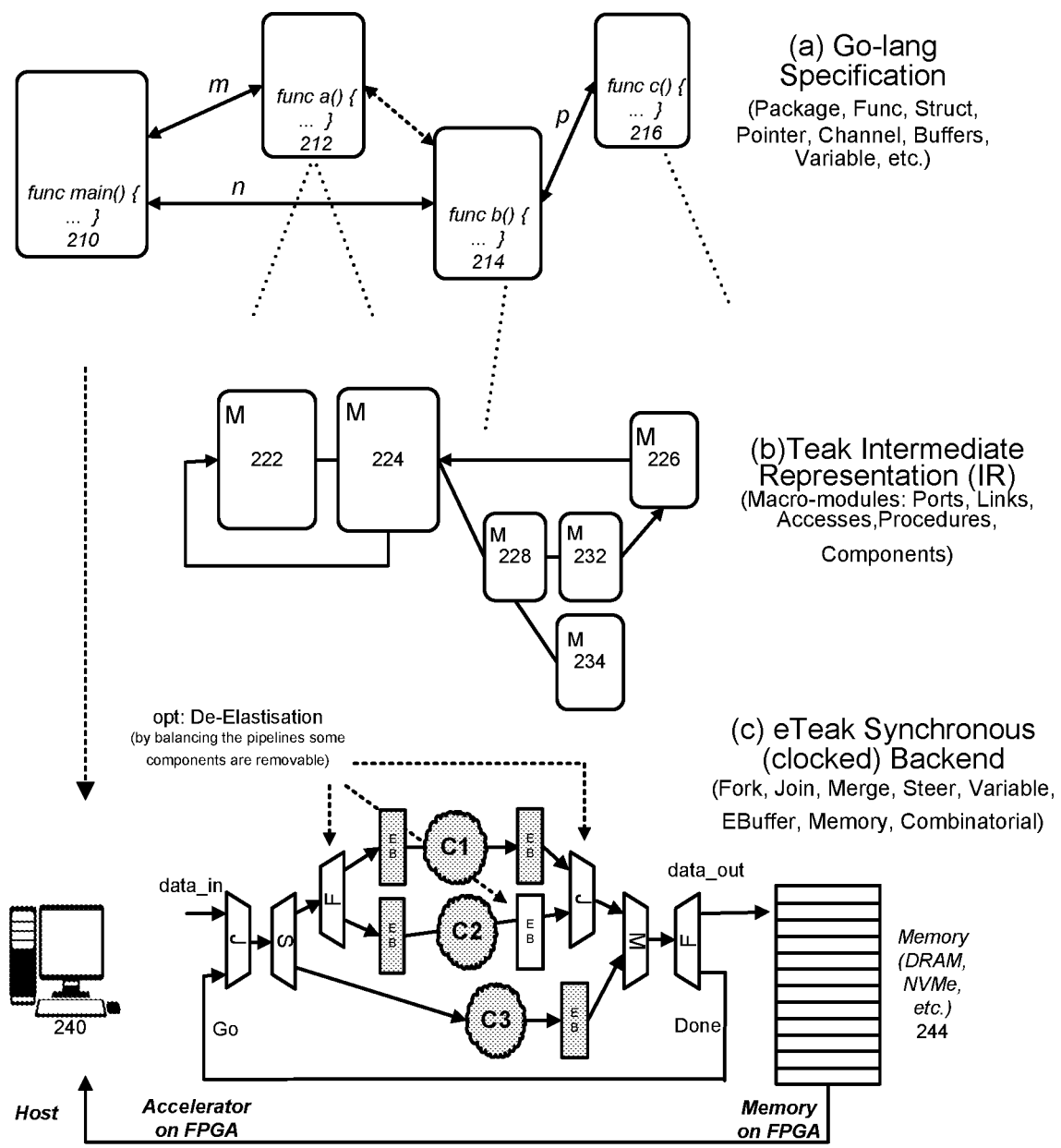
FIG. 2 illustrates three tier adaptation module of software and FPGA integration according to example embodiments.

FIG. 2 illustrates a detailed example of the processes performed by the eTeak compiler according to example embodiments. Referring to FIG. 2, the eTeak compiler in FIG. 1 is described in larger detail 200. Three stages take place to synthesize a high level GO description into digital circuits, the light weight GO functions are parsed from a main program file 210, evaluated and mapped onto a Teak intermediate representation (IR) using a BALSA frontend.

The functions parsed 212-216 from the main file are the basis of the accelerators placed in memory of the FPGA 244. Next, in (b) the TEAK IR is synthesized into macro-modules 222-234, the main constituents of the TEAK dataflow network. Each macro has a separate GO/done signal which determines the activation and termination of a process. Then, in part (c) ETEAK synchronous synthesis backend is exploited to generate FPGA synthesizable circuits. ETEAK uses the SELF protocol to realize a rigid synchronous communication between the dataflow primitives. ETEAK synthesized circuits inherit fine grained elasticity which is beneficial in terms of power but the circuits may suffer from unnecessary handshake overhead between the primitives. The control of the FPGA may be performed from a developer workstation 240.

De-elastization, as an optimization technique, is considered to introduce rigidity to the circuit by balancing the pipelines which removes the overhead of the fine grained communication between the primitives. As shown in the figure above introducing an additional EB to the middle pipeline permits the tool to remove the associated fork/join pair from the circuit. For high-level code partitioning (FIG. 1-b) the feedback from eTeak is critical in deciding which functions should reside at the host (PC) and which ones should be synthesized into hardware (i.e., an accelerator). The partitioning of the high-level code is based on the power, area and performance feedback received from the runnable patterns generated.

The de-elastization process retimes the fine grained handshake circuits of the eTeak by additional buffer insertion. This removes unnecessary elastic handshakes from the circuit and boosts the clock frequency and hence the throughput. A FPGA-compatible SELF elastic controller may be used on every data channel and are responsible for handling back-pressure and realizing elastic communication between the sequential procedures. The controllers are able to instrument a pair of D-type flip-flops. Every channel could have 0 to 'N' of the control flow blocks.

Software and hardware may be bridged using an AXI interconnect. Entities in the system level view are sequential processes that communicate via channels. The high-level GO channels are mapped onto communication links in the hardware infrastructure. Communication between systems is performed either via memory sharing or direct links, such as PCIe, NVLink, etc. The elastic channels of eTeak enable a latency-insensitive communication between the computing entities in the system.

Multiple accelerator function units (AFUs) could communicate either via channels mapped on a communication medium or via shared memory model using off-chip DRAM or utilize on-chip memories (BRAM) available on the FPGA. The CSP model is leveraged toward architecture scalability. The eTeak generated AFUs provides communication between the host processor and the on-board FPGA is facilitated and AXI wrappers are not shown in this figure for simplicity. There are techniques proposed for multiple AFU communication including network-on-chip (NoC) which requires the AFUs to be capable of processing/generating packets which requires routers for packet routing etc. Using the CSP model permits use of light weight procedures that communicate either using shared memory model or distributed memory model. Due to the slack elastic nature of the eTeak generated circuits these communication types are transformable to each other via retiming. By taking the available logic and the expected throughput in to account eTeak can apply these transformations automatically.

High level language (user interface) functions in GO language are implemented by the programmer. The GO high-level description is partitioned into host and accelerator codes (.go). The host code which is the main function and calls the reminder functions which are compiled using a go-lang compiler to generate executable files runnable on the host processor (.exe). The accelerator code is synthesized into accelerators. The Go accelerator code is parsed and an abstract syntax tree (AST) is constructed based on the tree format (.go.tree). In operation, the Teak compiler takes in the Balsa AST and optimizes it via conventional evaluate (.go.eval) and finish (go.finish) methods. The output of this step is a network of procedures in a Teak intermediate representation (IR) format (.teak). In Teak IR, every process is in the macro-module format which has separate 'go' and 'done' signals to determine activation and termination of a process.

eTeak, a synchronous backend, takes the Teak IR file and introduces a clock to it. Using the syntax directed translation method procedures in Teak IR, mappings may be performed onto synchronous (clocked) primitives of {Join, Fork, Steer, Merge, Variable, Elastic Block, Arbiter, Initial, Reset, Operator}. The output of this step is a gate level netlist in Verilog (.v). Introducing a clock has two major advantages: with a notion of synchronous timing the scheduling step is analyzable and optimizable using conventional synthesis tools and static timing analysis tools.

With a synchronous behavior data manipulation units (operators) are re-synthesizable. The generated synchronous netlist are synthesizable onto FPGAs. eTeak synthesized circuits are fine grained which is beneficial in terms of power but the circuits may suffer from unnecessary communication overhead between the primitives. De-elastisation, as an optimization technique, introduces rigidity to the circuit by retiming the pipelines which removes away the overhead of the fine grained communication between the primitives.

eTeak generated Verilog netlists are provided to a synthesis tool to generate single or multiple bitstreams loadable into one or more FPGA systems. The communication between the host and the accelerator is performed using a set of shared memory locations. Each accelerator has go/done signal that determines its start and finish time. This allows the host to interact with the accelerator on the FPGA effectively. A graphical mechanism then permits the high-level developers to visualize their code (.go) in the form of a synchronous dataflow graph (.eTeak) in which the flow of data is dynamically illustrated according to the timing information provided by the FPGAs (.timing.report). This enables the developer to debug the system at post-synthesis level where the timing information associated with IO and memories are available.

Continuing with the same example, mapping onto macro modules may include a Teak IR being built based on the macro-module style with separate 'go' and 'done' activation/termination signals. These modules are linked in sequence or parallel according to source level directives. The macro-module architecture contributes to a distributed control mechanism where the datapath and the corresponding control are enclosed within a macro-module. Accordingly, modules are controlled locally through handshaking, thus, whenever data become available, computation can begin. Based on this, data-dependent computation becomes possible which means that independent data streaming can exist within a module, which can significantly influence the performance of the circuit. In addition, it permits the tool to perform functional decomposition over a module and define new boundaries.

Scheduling the macro-modules based on the clock, is also referred to as retiming, which determines the arrangement between the macro-modules. For scheduling, buffers are employed on every link/channel to place the execution time between the macro-module in order. Using this technique, the out-of-order execution of the macro-modules becomes possible.

One example embodiment may include a high level cloud interface that permits the cloud programmer to submit the 'Go' implementation of a processing system (e.g. image processing) up to an acceleration infrastructure and partitioning the submitted Go description into host and accelerator codes (.go). With regard to the high-level patterns, GPUs or multicore architectures may be composed in a hybrid fashion with FPGAs. The host code is the main function and calls the reminder functions. The main function is compiled using golang compiler from Google to generate an executable file runnable on the host processor (.bin). The accelerator code is synthesized into accelerators. A process may include parsing the high-level go description and produce an abstract syntax tree (AST) based on the Balsa's abstract tree format (.go.tree). The Balsa AST is taken by Teak and optimized via conventional evaluate (.go.eval) and finish (go.finish) methods. The output of this step is a network of procedures in Teak intermediate representation (IR) format (.teak). In Teak IR every process is in the macro-module format which has separate 'go' and 'done' signals to determine activation and termination of a process. A process for introducing the clock to asynchronous dataflows, named eTeak includes taking the Teak IR file and introducing the clock signal to its data holding elements by adopting the SELF protocol. The process takes the Teak IR and maps it onto synchronous (clocked) primitives of {Join, Fork, Steer, Merge, Variable, Elastic Block, Arbiter, Initial, Reset, Operator} described below. The output of this step is a gate level netlist in Verilog (.v).

The clock may provide a notion of synchronous timing so the scheduling step is analyzable and optimizable using conventional synthesis tools and static timing analysis tools. With a synchronous behavior data manipulation units (operators) are re-synthesizable. The generated synchronous netlists are synthesizable onto FPGAs. De-elastisation is a mid-level optimization technique that introduces rigidity selectively to the circuit by retiming the pipelines which removes the overhead of the fine grained communication between the primitives. eTeak synthesized circuits are fine grained which is beneficial in terms of power and reliably but the circuits may suffer from unnecessary communication overhead between the primitives. Elasticity is useful for FPGA level place and routing. De-elastisation keeps elasticity at communication level between processes and removes it from the computation domain. Single or multiple bitstreams loadable onto a FPGA farm are generated using synthesis tools from FPGA vendors (such as Xilinx's Vivado).

An effective scalable communication infrastructure is needed between the host system and the accelerators. The communication is performed using a set of shared memory locations on a board. Each accelerator has go/done signal that determines its start and finish time. This permits the host to interact with the accelerators resident on the FPGA effectively.

A graphical process that assists the high-level developers to visualize their code (.go) in form of a synchronous dataflow graph (.eTeak) in which the flow of data is dynamically illustrated according to the timing information (switching traces) provided by the FPGAs (.timing.report). This enables the developer to debug the system at post-synthesis level where the timing information associated with IO and memories are available.

Macro-module primitives include steer (S) which chooses an output path based on the input control value attached to data. The primitives may select channels depending on availability. Steers are inferred wherever an if/else or case statement is used. Each parametrized output independently matches the conditions of input and acts like a data-dependent de-multiplexer. A fork (F) is a parameterizable component which can carry any number of bits from input to outputs and which brings concurrency to the circuit by activating two or more macro-modules at the same time or supplying them with data.

A merge (M) is an input on one of the input ports is multiplexed towards the output based on first-come-first-served policy, thus the inputs must be mutually exclusive. Merge is also parameterizable, which means that it can function as a data or control multiplexer. A join (J) synchronizes and concatenates data inputs. A two-way join of n and 0 bits can be used as a conjunction of data and control. Variable (V) permanent data storage. A variable (V) in the eTeak dataflow network has a single write port and multiple, parameterizable read ports, and supports multiple read and write variables mapped onto BRAMs of the FPGA. The 'reads' and 'writes' are distinguished and placed into separate stages. Variables permit complicated control activity without incurring the cost of always moving data along with control around a circuit. 'wg/wd' and 'rg/rd' (go/done) pairs make all writes data initiated and control token completed, all reads control token initiated and data delivery terminated. The variable can be considered as a multi-bit register in which a read means assigning the contents of the register to the output wire. Similarly, a write to a variable could be translated as assigning the current value of the input wire to the register. Operators (O) including floating point and other types are the components which can manipulate data. Inputs are formed into a single word. All data transforming operations are performed within this component, including verifying a condition or other operations.

Initial (I) is a component which holds an initial value and can insert values, such as activation into the network. When a top-level module is generated to start over and over within the loop structure a 'go' signal may not exist. In that case 'I' initializes the activation at each round. Elastic buffer (EB) is for data storage and channel decoupling. Buffers provide storage for valid and empty tokens and they are the only components that initiate and take an active part in handshaking, all other components are "transparent" to the handshaking. A buffer may input and store a new token valid or empty from its predecessor if its successor buffer has input and stored the token which it was previously holding. The arbiter (A) takes a number of input channels, and gives a single output channel, forwarding on any data from input channels to the output channel, fairly choosing between concurrent accesses. This component could be used as a memory or a bus arbiter to control several master accesses. If the masters are clocked at the same speed then arbiters could be implemented as synchronous arbiters (TeakM) otherwise they should be realized as asynchronous arbiters.

One practical example may be for supporting an image processing application, as an example, that is deployed onto the cloud and serves for billions of image search queries per day. Assuming this application is implemented in the GO language, one way of executing this application is by compiling it into machine code (i.e., assembly code) and executing it on a general purpose machine, such as ARM, IBM POWER, x86, etc. The generated assembly code will mostly comprise 32 or 64 bit MOVE, ADD, MULT, LOAD, STORE, type instructions. In a pipelined processor, each instruction has to be passed through the pipeline stages, including, for example, five cycles: Pre.Fetch, Fetch, Decode, Execute, WriteBack, may be part of the pipeline for every instruction.

According to the example embodiments, the presented synthesis flow takes in the input description of the application, such as a neural network, and generates a control-data flow graph, and then maps it into a FPGA friendly hardware logic. Finally, the target FPGA in the cloud is programmed using the generated logic. This permits the developer without FPGA skills to program and use the FPGA technology for computing large-scale big-data, such as image processing. Unlike processors and GPUs, the bitwise operations, data load/store are customizable, which provides that the entire computation could be performed using compact data types vs. full 32-bit floating point.

In a cloud based image processing technology, a large amount of images are submitted to a storage server in the cloud (e.g., AWS S3), next a software application that contains the higher order functions for processing images is deployed onto the cloud application server, depending on the nature of the application, proper setup usually accompanies the main source code (i.e., main file) which specifies the services, HTTP end-points, and other cloud services. For the sake of consistency with the detailed description, it is assumed that the application is implemented in the GO language.

Figure 3:
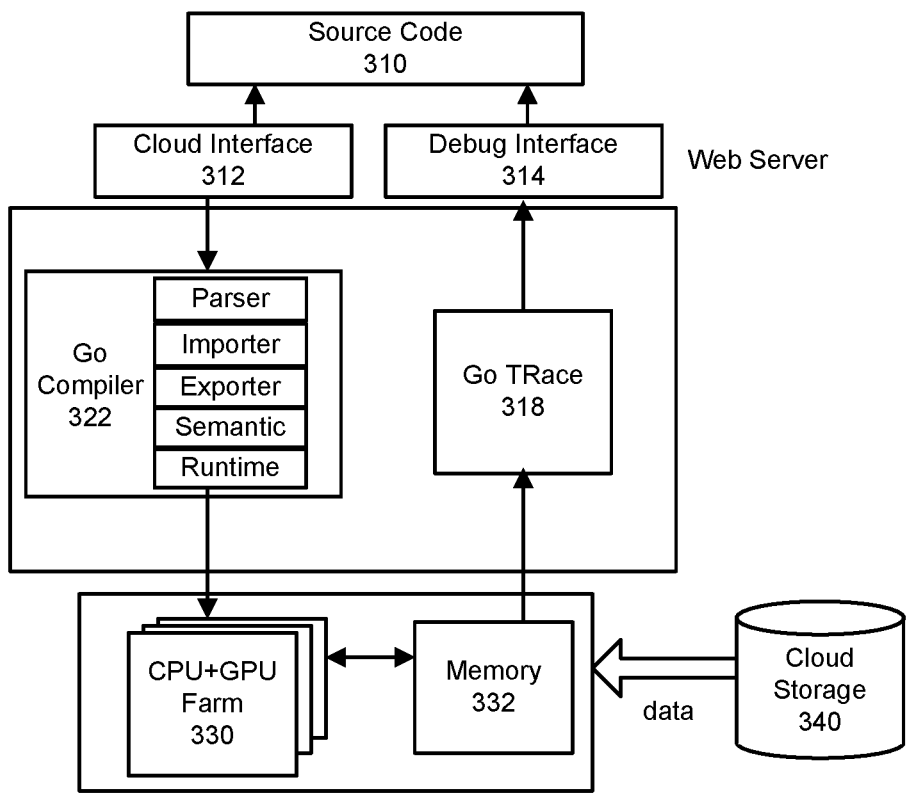
FIG. 3 illustrates an example of integration using a combined compiler approach according to example embodiments.

FIG. 3 illustrates a non-accelerator model 300, where the source code is parsed, linked, and compiled into machine code (i.e., assembly code) and finally executed on a set of general purpose processors, such as ARM, IBM POWER, x86, etc. The generated assembly code comprises of 32/64 bit MOVE, ADD, MULT, LOAD, STORE instructions, along with system calls to invoke IO, interrupt, and co-processing functions. In a pipelined processor, each instruction has to enter the pipeline stages, such as pre.Fetch, fetch, decode, execute, writeback, etc., as the pipeline is 'general' for every instruction. The source code 310 may be accessible via a cloud interface 312 and a debug interface 314. The server may include a GO compiler 322 and a go Trace function 318. The CPU farm 330 in the cloud may have its own memory 332 for processing main function files and corresponding software modules for processing images or other data 340 stored in the cloud.

Figure 4:
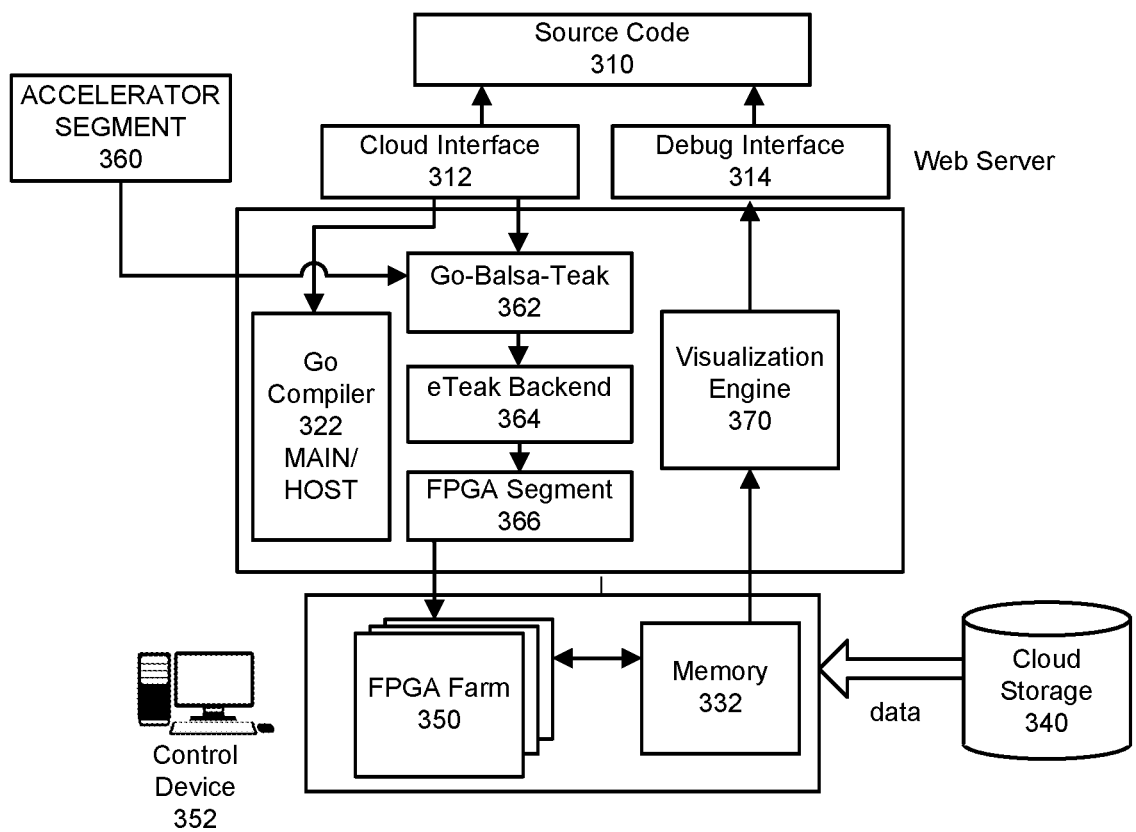
FIG. 4 illustrates an example logic circuit diagram of software FPGA integration with accelerator modules from main program execution according to example embodiments.

FIG. 4 illustrates an example FPGA processing platform with separated accelerator data according to example embodiments. Referring to FIG. 4, the system 400, like numerals represent like components in other figures. The cloud interface 312 is linked to two separate segments including the accelerator segment 360 and a GO compiler segment 322 which is setup to process the main file. The accelerator segment 360 includes a GO/BALSA/TEAK segment 362, an ETEAK backend 364 and a FPGA segment 366. The accelerators parsed from the main file may be forwarded to the FPGA memory space in the FPGA farm 350. In this image processing example, the input description of the application is received, such as a neural network, and a control-data flow graph is generated and mapped into a FPGA accessible hardware logic. The target FPGA in the cloud is programmed using the generated logic, which permits the developer without FPGA skills to program and use the FPGA technology for computing via a control device 352. A visualization engine 370 provides a feedback control feature to illustrate the processed code.

Unlike processors and GPUs, the bitwise operations and data load/store are customizable which indicates the entire computation could be performed using compact data types vs. full 32 bit floating point data types. This is far beyond CPU/GPUs. In operation, submitting the application (GO source code) by the developer via the cloud interface 312, an application may include a 'main( )' function and a set of parsed functions (accelerators) to be called by the main function. There are also packages to be imported by the main GO file (.go) that provide several built-in functions such as runtime( ).

This process may include initializing some data structure by the GO compiler, loading a data structure that is relevant to the application, which specifies the memory layout for the application and the arrangement for the machine code for being loaded to memory. Building a parse tree made of nodes. The parse tree is composed of leaves which are operations, types (references) and values, the parsed content is derived from the source code. Also, such a tool, such as BISON is a general purpose proprietary tool for generating parsers and is generically described as a general-purpose parser generator that converts a grammar description for a context-free grammar into a program to parse that grammar. Next, compiling the parse tree nodes (operations, types and values) into assembly code may be performed. Then, creating an object file (.o) that contains structure information to the external references such as other object files and a GO runtime, and loading object files into data/instruction memories after resolving the external references and generating an executable machine code by a cloud service.

At runtime, managing the reachable nodes and removing unreachables by a garbage collector may be performed, and initializing the memory allocator, cache, TLS table and heap sizes, may also be performed. Continuing with the same example, executing the 'Go' routines as separate threads may be performed by executing them on the multi/many core processors. As stated above GO is a concurrent language, the main function spawns GO routines to carry out tasks independently. The operating system is the one responsible for organizing the threads based on their data availability and dependency on other threads. The ideal situation is when each thread could run on a separate core of a processor. Each thread loads data from its memory, processes it, and writes the data back to memory.

Reporting the final results back to a user, after the program finishes the execution when 'all' of spawned threads complete their task is also helpful to view the result. The report could be in any format depending on the source code specification, e.g. a graph, a table, or a raw file containing output values. Also, reporting the runtime information/debug/traces back to the user upon request may also be performed. Runtime results are the monitored information by the cloud provider, and are used for profiling the application and identifying it's attributes in terms of communication and computation, memory read/write rates, etc. Those items could be used to unlock the deadlocks which is likely to occur in concurrent applications.

Figure 5:
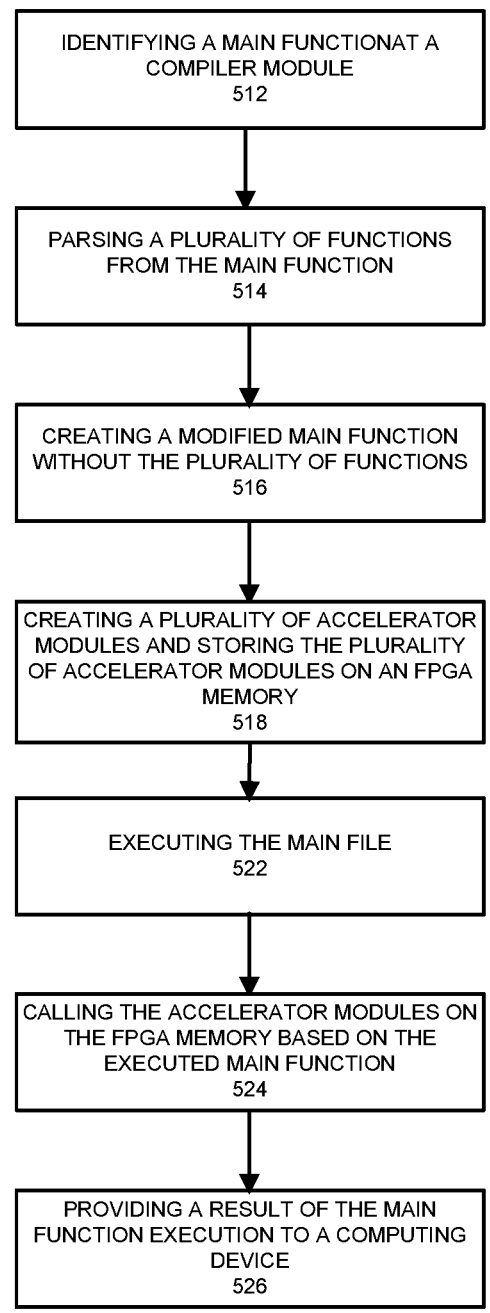
FIG. 5 illustrates an example logic flow diagram of performing FPGA programming according to example embodiments.

FIG. 5 illustrates an example flow diagram of managing data for FPGA execution according to example embodiments. Referring to FIG. 5, the method 500 may include submitting an application (i.e., GO source code) via a cloud interface, this may include a main function 512. A variety of functions may be parsed from the main function during processing 514, this may include partitioning the code into the main and accelerator functions to reduce a size of the main function. For example, by separating the main function from the accelerators/functions, which is the major caller that controls the sequence of initiations and terminations of the accelerators from the accelerator functions, which are the callees that do a particular task in hardware on FPGA, the result is one main file and two or more accelerator files/modules. The main function will be smaller in size 516 and will call the created accelerator modules 518 or files 516 from the FPGA memory when referenced from the main file execution. The main function can then be compiled using a compiler and the accelerators using the presented compiler. Since the main function is the only function/file being compiled at this time 522, the compiler of the main function is able to generate an executable file without the accelerator function being part of this operation, which provides for a much faster result. Later the main and the accelerator functions will be sharing a memory block for communication in the FPGA.

The accelerator functions are parsed and mapped to a mid-level dataflow graph. Separately, the accelerator functions are parsed and mapped to abstract syntax trees, such as parse trees. Then nodes are mapped to primitives (i.e., Join, Fork, Merge Steer, Channels, Variables). The dataflows are pipelined by iteratively going through the graph (i.e., de-elastization). In this operation, channels are buffered using extra memory blocks to avoid deadlocks, unnecessary stalls in processing, and to de-synchronize the processes. This technique is also known as slack matching, pipelining or retiming.

Continuing with the same example, the accelerators are compiled into VERILOG RTL logic using the ETEAK compiler. The process of synthesizing provides for asynchronous graphs of TEAK being introduced with a timed (i.e., clocked) procedure which makes them synthesizable onto FPGAs. Transforming the asynchronous procedures into one or several synchronous logic units is performed via the main function separation from the accelerator files. The generated logic may be wrapped in proper shells to enable interaction with the environment (e.g., PCIe), off-chip memories (DDR3/4, Flash), DMAs, etc. Shells may be VERILOG RTL implementations which facilitate the communication between the accelerators and the environment by coupling the input/output channels of the accelerators to the shared memory locations visible to the processor and any computer system. Deploying an object file executable on a CPU and the FPGA programmable bitstream, which use shared memory model to communicate initiation and termination of the accelerators, is performed by a cloud service manager and based on the content of the main file 524. When reporting the results back to the developer, after the program finishes execution 526, the report could be in any format depending on the source code specification, e.g. a graph, a table, or a raw file containing output values. It is also possible to transfer information via API gateways to the user provided by the cloud service to provide output over HTTP to a user's web page, in one example.

Runtime results are based on the monitored information by the cloud provider, and are used for profiling the application and identifying its behavior in terms of communication and computation, memory read/write rates, etc. Such information could be used to unlock the deadlocks which are plausible to occur in concurrent applications. To trace the behavior of the accelerator, a debug core is inserted into the FPGA, this is provided by the hardware development environment. The 'accelerators' may be defined as accelerable portions of the source GO code, which are either specified explicitly by the user and implemented as a separate function marked by the compiler implicitly as software patterns that could significantly benefit from being synthesized onto FPGAs, e.g., loops in SIMD or VLIW form, iterative data manipulation in For-Loops that could be unrolled and pipelined, etc.

One example of a GO main file prior to modified structure (i.e., a modified main) may provide

```
// A concurrent prime sieve
    package main
    // Send the sequence 2, 3, 4, ... to channel 'ch'.
    func Generate(ch chan<- int) {
        for i := 2; ; i++ {
            ch <- i // Send 'i' to channel 'ch'.
        }
    }
    // Copy the values from channel 'in' to channel
'out',
    // removing those divisible by 'prime'.
    func Filter(in <-chan int, out chan<- int, prime
int) {
        for {
            i := <-in // Receive value from 'in'.
            if i%prime != 0 {
                out <- i // Send 'i' to 'out'.
            }
        }
    }
    // The prime sieve: Daisy-chain Filter processes.
    func main( ) {
        ch := make(chan int) // Create a new channel.
        go Generate(ch)         // Launch Generate
goroutine.
        for i := 0; i < 10; i++ {
            prime := <-ch
            print(prime, "\n")
            ch1 := make(chan int)
            go Filter(ch, ch1, prime)
            ch = ch1
        }
    }.
```

As may be observed from the main function, the 'Filter' and 'Generate' functions are defined as specific computational functions included within the original main file and then called in the main function as noted above. According to example embodiment, the accelerator files can pull the functions out and store them in FPGA memory spaces, and the main function can use a replacement bit in memory as a signal to begin processing. The memory stores the generate results, initiations and terminations, which have taken place in the main function.

Figure 6:
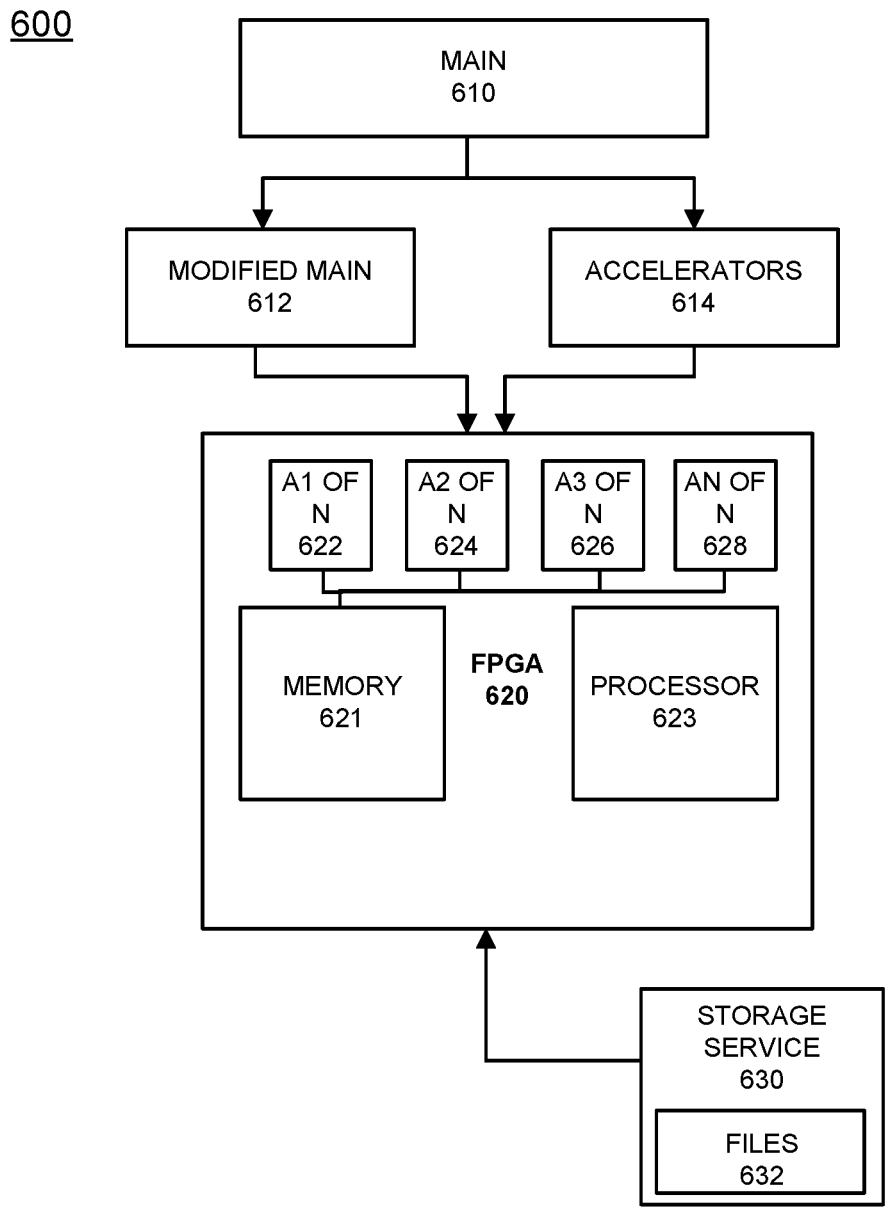
FIG. 6 illustrates an example configuration of separating and storing accelerator modules on an FPGA according to example embodiments.

FIG. 6 illustrates an example FPGA optimization procedure according to example embodiments. Referring to FIG. 6, the system 600 includes a main file or program 610 which is processed to create a modified main portion 612 and a set of accelerators 614 as extracted functions from the main file. The FPGA 620 may be include core FPGA components and a shared memory space 621 used to store the separate accelerators 622-628. The accelerators may be linked to shared memory via channels designated by the accelerator definitions or the main function. The FPGA may also have a processor 623 for executing instructions. In the example of the image processing of large scale images associated with a search engine query, the storage service 630 in the cloud may store a large number of files 632, which may be relevant to the query received. For example, if a user submitted a query for dogs or dogs wearing hats, all such images associated with the search engine and stored in the cloud may be retrieved and sorted according to FPGA logic stored in the accelerators. In order to provide real time results, the accelerators may be organized via channels and may have a correspondence with a main file from which they were originally derived. The result of the various accelerators being executed may yield image results organized in a manner consistent with the query.

In one example embodiment, a method of operation may include identifying a main function at a compiler module, parsing a plurality of functions from the main file, creating a modified main function without the plurality of functions, and creating a plurality of accelerator modules and storing the plurality of accelerator modules on a field programmable gate array (FPGA) memory space of a FPGA. The method may also include executing the modified main function, calling the accelerator modules on the FPGA memory space based on the executed modified main function, and providing a result of the modified main function execution to a computing device.

The main function is a function that calls multiple functions/accelerators or sub-functions, submitted through the cloud interface. The main function is the function/file that calls the accelerators, initiates the accelerators/sub-functions. In this example, once the functions are removed, the main function may still reference and identify those functions. When the main function is submitted to a preprocessing stage, via an API or cloud service provider, the main function may include several function calls, such as GO keyword routines. Once the main file is compiled, the data response is returned as having been processed. A GO function may read this data and the accelerators are created based on the original content of the main function. The main function may enable a data realization, such as a graph or other reporting feature. The compiler may be a 'GO' compiler that parses the source code, exports the code and creates a runtime. The functions are parsed to create executable files or the accelerators. The accelerators are ordered based on their order to be called by the main function. The main function can be linked to graphic functions, which are written and identified by the main function '.exe'. An accelerator may have a data pending status, the accelerators may be ordered especially if the pending data from one accelerator (A1) is not available or is available via another accelerator (A2). In this example, A2 may finish processing first, and then A1 can be called accordingly, depending on the dependency. The channels between accelerators may be written as channel keywords, for example, the main function may create a channel as a memory block/pointer, such as a memory address in the FPGA. Accelerator 'A1' may create a channel as a memory location, the channels can be mapped as any communication link, for example, a command to read to a specific memory location. The main function will be maintained outside the FPGA and is processed via a CPU, while the accelerators are stored in the FPGA memory. The channel may be a PCI or PCIe link, memory location, in the hardware, but is identifiable as a communication medium, which are passed to the accelerators as pointers, and which are mapped between accelerators, and can be referred to as mappings. The channels are also communication mediums which may work with BRAM and ERAM. The channels are created as mappings within the FPGA when the accelerators are created and placed in the FPGA memory space. The channels are identified from the accelerators and are placed in the accelerators and utilized by the main function.

The parsing is performed by identifying functions. The functions can be identified via their code parameter type (i.e., 'function' code naming convention). The syntax tree that is generated during the parsing is mapped from every node in the tree to machine code or a hardware description language. The nodes are primitive, such as data flow primitives, join, fork, etc. Each node in the parse tree is mapped to a macro-module to identify the dependencies, such as nodes requiring other nodes, predecessor nodes required for other nodes. The tree has nodes and edges and the edges are the dependencies between the nodes, the nodes/macro-modules are implemented to be mapped to TEAK primitives. A clock can be used to synchronize the VERILOG netlist which is deployable/readable onto FPGA. The CPU performs run time, library linking, maintains accelerator references, table, pointers, addresses, the addresses to the memory in the FPGA. The result may be based on shared CPU vs. FPGA memory spaces, the completion of the main modified file may be performed by the main file execution reading the FPGA memory spaces and utilizing the accelerators. The result will include the data processed by the accelerators being transferred to an API interface or other application. Some examples of a final result may be the results of a query, or other result may be returned, such as an array of data to be plotted, search engine results which are transformed into a web browser interface.

Continuing with the same example embodiment the accelerator modules may be accessed during executing of the modified main function via channels performed via the compiler. The parsing of the plurality of functions from the main function may further provide identifying instances of functions, identified by function syntax, such as 'func' and removing code associated with the plurality of functions from the modified main function and leaving calls to the functions by name. The example method may provide creating different ones of the plurality of accelerator modules corresponding to each of the identified functions. The method may also provide calling at least one of the plurality of accelerator modules from the accelerator modules from a defined channel corresponding to a memory location in the FPGA memory space. However, the main function is processed via a processor outside the FPGA, such as a CPU. The creating of the modified main function further includes creating references to each of the parsed functions and a reference to memory space locations, associated with the plurality of accelerator modules, in the modified main function.

Another example embodiment may provide a method of creating synchronous hardware accelerators from concurrent asynchronous programs at software level, the method may include obtaining input as software instructions describing concurrent behavior via a model of communicating sequential processes (CSP) of message exchange between concurrent processes performed via channels, mapping, on a computing device, each of the concurrent processes to synchronous dataflow primitives, comprising at least one of join, fork, merge, steer, variable, and arbiter, producing a clocked digital logic description for upload to one or more field programmable gate array (FPGA) devices, performing primitive remapping of the output design for throughput, clock rate and resource usage via retiming, and creating an annotated graph of the input software description for debugging of concurrent code for the field FPGA devices.

Continuing with the same example, the method may also include identifying a main function, parsing a plurality of functions from the main function, creating a modified main function without the plurality of functions, creating the synchronous hardware accelerators based on the plurality of functions and storing the synchronous hardware accelerators on a field programmable gate array (FPGA) memory space of the FPGA, executing the modified main function, calling the synchronous hardware accelerators on the FPGA memory space based on the executed modified main function, and providing a result of the modified main function execution to the computing device.

The synchronous hardware accelerators are accessed during executing of the modified main function via channels. The parsing of the plurality of functions from the main function further includes identifying instances of functions, identified by function syntax, and removing code associated with the plurality of functions from the modified main function. The method may also include creating a different one of the synchronous hardware accelerators corresponding to each of the identified functions, and calling at least one of the synchronous hardware accelerators from at least one other of the synchronous hardware accelerators from at least one of the channels corresponding to a specific memory location in the FPGA memory space. The main function is processed via a processor outside the FPGA, and wherein creating the modified main function further comprises creating references to each of the parsed functions and at least one reference to memory space locations, associated with the synchronous hardware accelerators, in the modified main function.

The operations of a method or algorithm described in connection with the embodiments disclosed herein may be embodied directly in hardware, in a computer program executed by a processor, or in a combination of the two. A computer program may be embodied on a computer readable medium, such as a storage medium. For example, a computer program may reside in random access memory ("RAM"), flash memory, read-only memory ("ROM"), erasable programmable read-only memory ("EPROM"), electrically erasable programmable read-only memory ("EEPROM"), registers, hard disk, a removable disk, a compact disk read-only memory ("CD-ROM"), or any other form of storage medium known in the art.

An exemplary storage medium may be coupled to the processor such that the processor may read information from, and write information to, the storage medium. In the alternative, the storage medium may be integral to the processor. The processor and the storage medium may reside in an application specific integrated circuit ("ASIC"). In the alternative, the processor and the storage medium may reside as discrete components. For example FIG. 7 illustrates an example network element 700, which may represent any of the above-described network components of the other figures.

Figure 7:
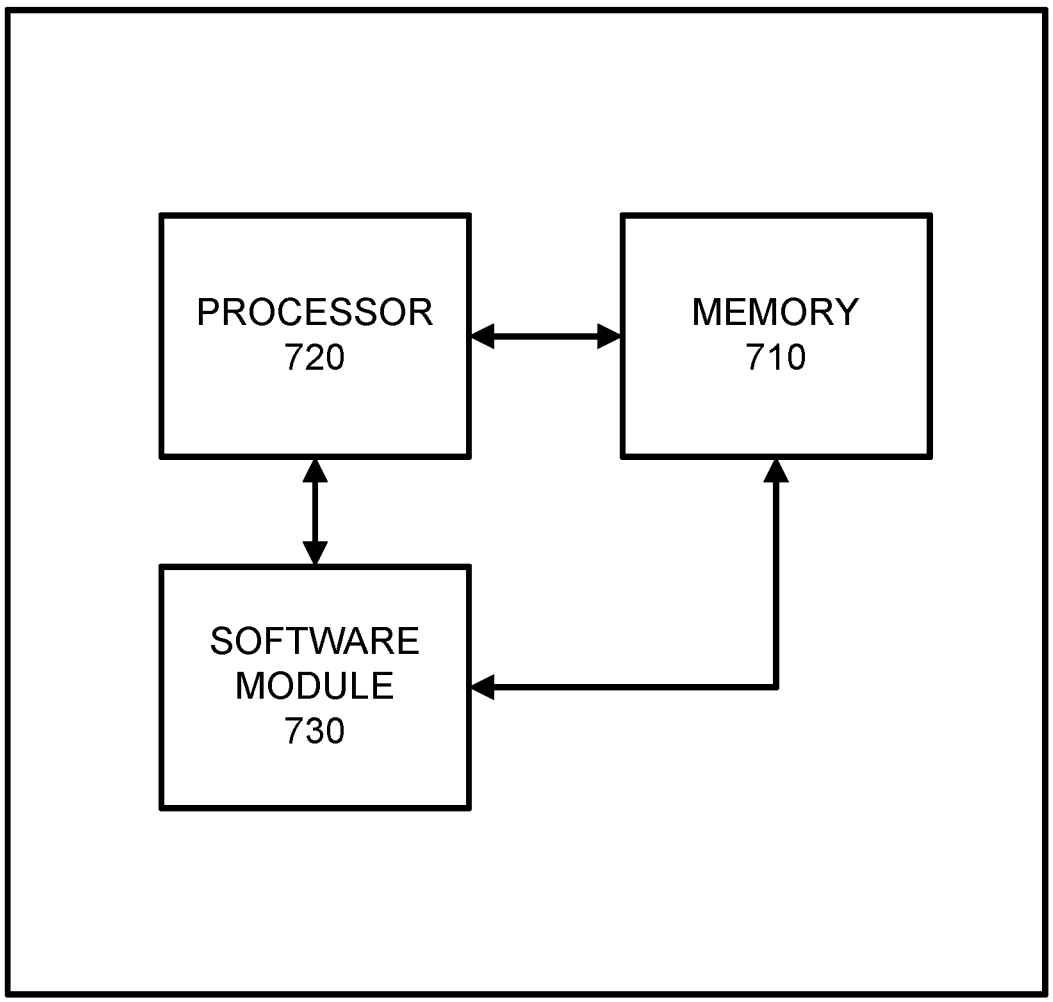
FIG. 7 illustrates an example network entity device configured to store instructions, software, and corresponding hardware for executing the same, according to example embodiments of the present application.

As illustrated in FIG. 7, a memory 710 and a processor 720 may be discrete components of the network entity 700 that are used to execute an application or set of operations. The application may be coded in software in a computer language understood by the processor 720, and stored in a computer readable medium, such as, the memory 710. The computer readable medium may be a non-transitory computer readable medium that includes tangible hardware components in addition to software stored in memory. Furthermore, a software module 730 may be another discrete entity that is part of the network entity 700, and which contains software instructions that may be executed by the processor 720. In addition to the above noted components of the network entity 700, the network entity 700 may also have a transmitter and receiver pair configured to receive and transmit communication signals (not shown).

Although an exemplary embodiment of the system, method, and computer readable medium of the present invention has been illustrated in the accompanied drawings and described in the foregoing detailed description, it will be understood that the invention is not limited to the embodiments disclosed, but is capable of numerous rearrangements, modifications, and substitutions without departing from the spirit or scope of the invention as set forth and defined by the following claims. For example, the capabilities of the various embodiments can be performed by one or more of the modules or components described herein or in a distributed architecture and may include a transmitter, receiver or pair of both. For example, all or part of the functionality performed by the individual modules, may be performed by one or more of these modules. Further, the functionality described herein may be performed at various times and in relation to various events, internal or external to the modules or components. Also, the information sent between various modules can be sent between the modules via at least one of: a data network, the Internet, a voice network, an Internet Protocol network, a wireless device, a wired device and/or via plurality of protocols. Also, the messages sent or received by any of the modules may be sent or received directly and/or via one or more of the other modules.

One skilled in the art will appreciate that a "system" could be embodied as a personal computer, a server, a console, a personal digital assistant (PDA), a cell phone, a tablet computing device, a smartphone or any other suitable computing device, or combination of devices. Presenting the above-described functions as being performed by a "system" is not intended to limit the scope of the present invention in any way, but is intended to provide one example of many embodiments of the present invention. Indeed, methods, systems and apparatuses disclosed herein may be implemented in localized and distributed forms consistent with computing technology.

It should be noted that some of the system features described in this specification have been presented as modules, in order to more particularly emphasize their implementation independence. For example, a module may be implemented as a hardware circuit comprising custom very large scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, random access memory (RAM), tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

It will be readily understood that the components of the invention, as generally described and illustrated in the figures herein, may be arranged and designed in a wide variety of different configurations. Thus, the detailed description of the embodiments is not intended to limit the scope of the invention as claimed, but is merely representative of selected embodiments of the invention.

One having ordinary skill in the art will readily understand that the invention as discussed above may be practiced with steps in a different order, and/or with hardware elements in configurations that are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

What is claimed is:

1. An apparatus configured to create synchronous hardware accelerators from concurrent asynchronous programs, the apparatus comprising:
   a processor configured to
      obtain input as software instructions that describes concurrent behavior via a model of communicating sequential processes (CSP) of message exchange between concurrent processes performed via channels;
      map each of the concurrent processes to synchronous dataflow primitives, comprising at least one of join, fork, merge, steer, variable, and arbiter;
      produce a clocked digital logic description for upload to one or more field programmable gate array (FPGA) devices;
      perform a primitive remap of the output design for throughput, clock rate and resource usage via a retime; and
      create an annotated graph of the input software description for a debug of concurrent code for the field FPGA devices;
      identify a main function;
      parse a plurality of functions from the main function;
      create a modified main function by a removal of the plurality of functions from the main function;
      create the synchronous hardware accelerators based on the plurality of functions and store the synchronous hardware accelerators on a field programmable gate array (FPGA) memory space of the FPGA;
      execute the modified main function;
      call the synchronous hardware accelerators on the FPGA memory space based on the executed modified main function; and
      provide a result of the modified main function execution to the computing device.

2. The apparatus of claim 1, wherein the processor is further configured to store a replacement bit in memory to represent the main function, wherein the replacement bit is used as a signal to begin to process the main function.

3. The apparatus of claim 1, wherein the synchronous hardware accelerators are accessed during an execution of the modified main function via channels.

4. The apparatus of claim 1, wherein the parse of the plurality of functions from the main function further comprises an identification of instances of functions, identified by function syntax, and a removal of code associated with the plurality of functions from the modified main function.

5. The apparatus of claim 4, wherein the processor is further configured to
create a different one of the synchronous hardware accelerators that correspond to each of the identified functions.

6. The apparatus of claim 5, wherein the processor is further configured to
call at least one of the synchronous hardware accelerators from at least one other of the synchronous hardware accelerators from at least one of the channels that correspond to a specific memory location in the FPGA memory space.

7. The apparatus of claim 1, wherein the main function is processed via a processor outside the FPGA, and wherein the modified main function being created further comprises a creation of references to each of the parsed functions and at least one reference to memory space locations, associated with the synchronous hardware accelerators, in the modified main function.

8. A method of creating synchronous hardware accelerators from concurrent asynchronous programs, the method comprising:
obtaining input as software instructions describing concurrent behavior via a model of communicating sequential processes (CSP) of message exchange between concurrent processes performed via channels;
mapping, on a computing device, each of the concurrent processes to synchronous dataflow primitives, comprising at least one of join, fork, merge, steer, variable, and arbiter;
producing a clocked digital logic description for upload to one or more field programmable gate array (FPGA) devices;
performing primitive remapping of the output design for throughput, clock rate and resource usage via retiming;
creating an annotated graph of the input software description for debugging of concurrent code for the field FPGA devices;
identifying a main function;
parsing a plurality of functions from the main function;
creating a modified main function by removing the plurality of functions from the main function;
creating the synchronous hardware accelerators based on the plurality of functions and storing the synchronous hardware accelerators on a field programmable gate array (FPGA) memory space of the FPGA;
executing the modified main function;
calling the synchronous hardware accelerators on the FPGA memory space based on the executed modified main function; and
providing a result of the modified main function execution to the computing device.

9. The method of claim 8, further comprising:
storing a replacement bit in memory to represent the main function, wherein the replacement bit is used as a signal to begin processing the main function.

10. The method of claim 8, wherein the synchronous hardware accelerators are accessed during executing of the modified main function via the channels.

11. The method of claim 8, wherein the parsing of the plurality of functions from the main function further comprises identifying instances of functions, identified by function syntax, and removing code associated with the plurality of functions from the modified main function.

12. The method of claim 11, further comprising:
creating a different one of the synchronous hardware accelerators corresponding to each of the identified functions.

13. The method of claim 12, further comprising:
calling at least one of the synchronous hardware accelerators from at least one other of the synchronous hardware accelerators from at least one of the channels corresponding to a specific memory location in the FPGA memory space.

14. The method of claim 8, wherein the main function is processed via a processor outside the FPGA, and wherein creating the modified main function further comprises creating references to each of the parsed functions and at least one reference to memory space locations, associated with the synchronous hardware accelerators, in the modified main function.

15. A non-transitory computer readable storage medium configured to store instructions that when executed causes a processor to perform creating synchronous hardware accelerators from concurrent asynchronous programs, the processor being configured to perform:
obtaining input as software instructions describing concurrent behavior via a model of communicating sequential processes (CSP) of message exchange between concurrent processes performed via channels;
mapping, on a computing device, each of the concurrent processes to synchronous dataflow primitives, comprising at least one of join, fork, merge, steer, variable, and arbiter;
producing a clocked digital logic description for upload to one or more field programmable gate array (FPGA) devices;
performing primitive remapping of the output design for throughput, clock rate and resource usage via retiming;
creating an annotated graph of the input software description for debugging of concurrent code for the field FPGA devices;
identifying a main function;
parsing a plurality of functions from the main function;
creating a modified main function by removing the plurality of functions from the main function;
creating the synchronous hardware accelerators based on the plurality of functions and storing the synchronous hardware accelerators on a field programmable gate array (FPGA) memory space of the FPGA;
executing the modified main function;
calling the synchronous hardware accelerators on the FPGA memory space based on the executed modified main function; and
providing a result of the modified main function execution to the computing device.

16. The non-transitory computer readable storage medium of claim 15, wherein the processor is further configured to perform:
storing a replacement bit in memory to represent the main function, wherein the replacement bit is used as a signal to begin processing the main function.

17. The non-transitory computer readable storage medium of claim 15, wherein the synchronous hardware accelerators are accessed during executing of the modified main function via the channels.

18. The non-transitory computer readable storage medium of claim 15, wherein the parsing of the plurality of functions from the main function further comprises identifying instances of functions, identified by function syntax, and removing code associated with the plurality of functions from the modified main function.

19. The non-transitory computer readable storage medium of claim 18, wherein the processor is further configured to perform:
    creating a different one of the synchronous hardware accelerators corresponding to each of the identified functions.

20. The non-transitory computer readable storage medium of claim 18, wherein the processor is further configured to perform:
    calling at least one of the synchronous hardware accelerators from at least one other of the synchronous hardware accelerators from at least one of the channels corresponding to a specific memory location in the FPGA memory space, and wherein the main function is processed via a processor outside the FPGA, and wherein creating the modified main function further comprises creating references to each of the parsed functions and at least one reference to memory space locations, associated with the synchronous hardware accelerators, in the modified main function.

* * * * *